United States Patent
Poindexter et al.

(10) Patent No.: US 9,552,455 B2
(45) Date of Patent: Jan. 24, 2017

(54) METHOD FOR AN EFFICIENT MODELING OF THE IMPACT OF DEVICE-LEVEL SELF-HEATING ON ELECTROMIGRATION LIMITED CURRENT SPECIFICATIONS

(71) Applicant: GLOBALFOUNDRIES INC., Grand Cayman, KY (US)

(72) Inventors: Daniel J. Poindexter, Cornwall-on-Hudson, NY (US); Gregory G. Freeman, Wappingers Falls, NY (US); Siyuranga O. Koswatta, Carmel, NY (US); J. Campbell Scott, Los Gatos, CA (US); Leon J. Sigal, Monsey, NY (US); James D. Warnock, Somers, NY (US)

(73) Assignee: GLOBALFOUNDRIES INC., Grnd Cayman (KY)

( * ) Notice: Subject to any disclaimer, the term of this patent is extended or adjusted under 35 U.S.C. 154(b) by 74 days.

(21) Appl. No.: 14/612,683

(22) Filed: Feb. 3, 2015

(65) Prior Publication Data
US 2016/0224717 A1 Aug. 4, 2016

(51) Int. Cl.
*G06F 17/50* (2006.01)

(52) U.S. Cl.
CPC .................. *G06F 17/5081* (2013.01)

(58) Field of Classification Search
USPC ......................................... 716/112, 113, 115
See application file for complete search history.

(56) References Cited

U.S. PATENT DOCUMENTS

| 2009/0031264 A1 | 1/2009 | Rittman et al. |
| 2009/0224356 A1* | 9/2009 | Chandra ............. G06F 17/5009 257/499 |
| 2012/0317529 A1 | 12/2012 | Agarwal et al. |
| 2013/0298101 A1* | 11/2013 | Chandra ................. G06F 17/50 716/136 |

FOREIGN PATENT DOCUMENTS

JP 4081915 2/2000

OTHER PUBLICATIONS

"Physical Insight Toward Heat Transport and an Improved Electrothermal Modeling Framework for FinFET Architectures", Shrivastava, et al; IEEE, vol. 59, No. 5, May 2012.

* cited by examiner

*Primary Examiner* — Brian Ngo

(57) ABSTRACT

An efficient method of calculating maximum current limits for library gates in which a current limit includes the impact of self-heating effects associated with the maximum current. A maximum current solution is obtained in a self-consistent fashion, providing a way of determining the self-consistent solution in a rapid fashion without extensive numerical calculations or simulations. The present method provides a practical approach for characterizing a large library of gates for use in CMOS designs.

15 Claims, 3 Drawing Sheets

METHOD FOR AN EFFICIENT MODELING OF THE IMPACT OF DEVICE-LEVEL SELF-HEATING ON ELECTROMIGRATION LIMITED CURRENT SPECIFICATIONS

FIELD OF THE INVENTION

The present disclosure relates to the design and analysis of CMOS digital circuitry, specifically, to a standard cell library characterization, and more particularly to a efficient analysis of the impact created by self-heating on the reliability of logic, or other gates in a digital design library.

BACKGROUND

In modern CMOS designs, as devices have scaled into a regime with channel lengths below 50 nm, the heat generated by the switching of digital logic gates or by their leakage, can no longer be efficiently dissipated through the substrate. Recent developments in silicon technology have exacerbated this issue, while at the same time, interconnect reliability is becoming increasingly subject to electromigration stress in advanced technology nodes due to a breakdown in the classical scaling of such devices. One development has been the use of silicon-on-insulator (SOI) technologies for high-performance CMOS designs. In such technologies, the buried oxide acts as a thermal insulator or barrier between the devices, which dissipate power as they are switched at high frequency, especially when driving heavy loads, and the substrate, acting a heat sink.

Another more recent development has been the introduction of multigate "finFET" technologies, which even when built on a bulk substrate, can result in significant self-heating due to the higher density of active channel width per unit area of silicon, and the high-resistance thermal path to the substrate (either through the fin itself, which is very narrow, or through the field oxide, which has a high thermal resistance). Therefore, self-heating has become a design concern for high-performance circuitry, and is expected to become increasingly important as technology scales to even smaller dimensions.

In the current art, in CMOS digital design methodology frameworks, the circuit temperature is specified as a chip level design parameter, usually matching the modeled substrate temperature for the chip. This is a reasonable assumption for older bulk planar technologies, where the device is fabricated in the bulk silicon itself, with a good thermal connection to the substrate. However it breaks down for SOI technologies, where there is a high-resistance thermal barrier between the device and the substrate. It also breaks down for finFET technologies, where there also is a poor thermal connection to the silicon substrate. In these situations, self-heating can become non-negligible even within regular CMOS logic gates, with high switching factors and/or high output loads. This device-level heating heats up the wires above the hot devices, reducing the electromigration lifetime of the wires, so that any internal logic gate connections, carrying DC current, will suffer a reduced lifetime. Now, in such technologies, thermal modeling techniques have been used to look at specific circuits and specific device heating scenarios. But these thermal modeling techniques require a significant number of computations and calculations for even very simple geometries, as described for example by Shrivastava et al., in IEEE Trans on Electron Devices, vol. 59, page 1353 (2012). No tools or methods currently exist for incorporating the device-self-heating effects, and the impact on electromigration into a digital CMOS design methodology capable of handling designs with hundreds of millions of logic gates. Accordingly, the current state-of-the-art CMOS design methodologies either just ignore any logic-gate self-heating, or apply blanket assumptions to all gates. This can be very pessimistic, if the worst-case temperature increase has to be assumed to apply to all gates, or very optimistic, if the temperature is set at some average value for every gate independent of the actual self-heating that is present.

The basic problem here is that, in conventional design methodologies, the maximum-current limits that are set, based on electromigration statistics for metal lines, do not take into account the device self-heating which would be associated with the generation of that current. Furthermore, it is not easy to do this in a self-consistent way, since the current limit due to electromigration is a complicated, nonlinear function of the temperature of the wire. Furthermore, the thermal resistance of a library cell is very difficult to calculate, and can require detailed modeling with a 3D thermal analysis tool, taking into account the details of the structure of the gate, its wiring, the properties of all the different layers and materials making up the devices, and the details of the boundary conditions around the library cell.

It should be noted that Joule self-heating of wires is a well-known phenomenon, and various tools and methodologies have been developed to model the heating, and to guard against it. Furthermore, methods for EM analysis including self-heating treat only self-heating of wires (Joule heating), but not of the devices. Also such methodology is focused on rules designed to avoid any self-heating, not on including those effects in the analysis. The prior art treats self-heating of wires on methods to model, or avoid, wire self-heating, i.e., Joule heating. Other work focuses on self-heating effects on the delay of the gate, and is not applicable to the problem of setting current limits for electromigration robustness.

Referring to FIG. 1, a prior art library characterization flow is shown, covering an aspects of defining the maximum current (limited by electromigration) for each library cell.

Still referring to FIG. 1, starting with 100, a library cell is selected for analysis. Next, in 103, a maximum current, I0 is calculated based on a conventional electromigration analysis of the cell, including as inputs the detailed geometries of the wires, an assumed temperature, and the reliability specifications (electromigration equations, allowed failure rate and the total number of hours of use). The final result is assigned to the cell in question, in 106, and then if there are more library cells to be processed (107) another cell is chosen for analysis. Otherwise, the process terminates (108). In the present analysis, a worst-case temperature can be chosen in 103, in order to guard against the worst-case self-heating that could be encountered in a design application. However, it would be pessimistic to apply it to all cells, since many of the cells would see much less self-heating than the worst-case situation. On another hand, if an "average" temperature is selected, the design can end up with severe reliability exposures since some gates can experience higher temperatures becoming subjected to wear out.

BRIEF DESCRIPTION OF THE DRAWINGS

The present disclosure will be understood and appreciated more fully from the following detailed description of the disclosure, taken in conjunction with the accompanying drawings.

SUMMARY

Figure 1:
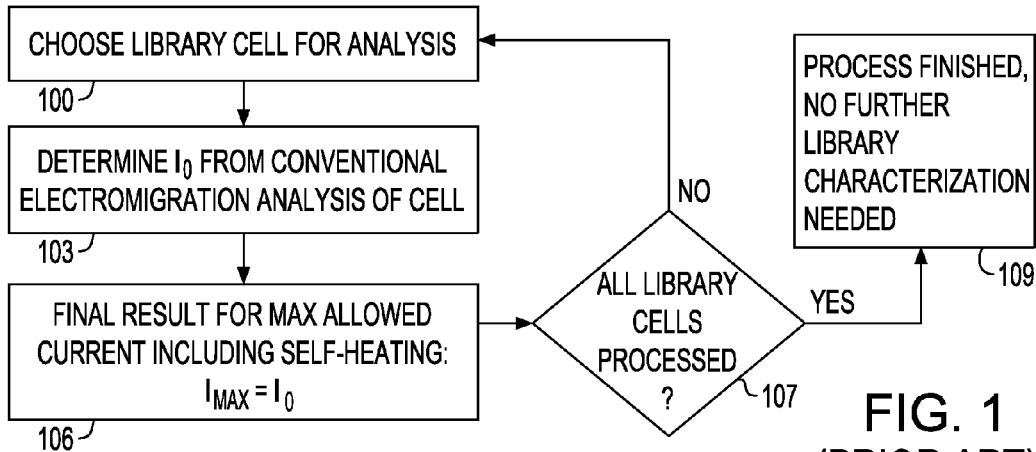
FIG. 1 is a flow diagram of a library characterization process to determine the maximum allowed current flow for each library cell, without any detailed treatment of self-heating effects, as known in the prior art.

Accordingly, in an embodiment, a method is provided to approximate and model a CMOS library cell thermal conductivity based on generic physical attributes, i.e., width and/or height of cell, and/or number and/or size of device fingers, achieving a rapid characterization of logic gates in a standard cell library, allowing an efficient determination of a self-consistent maximum current limit.

In an embodiment, the method calculates a universal curve for electromigration current allowance reduction from self-heating as a function of the increasing temperature obtained from a thermal analysis based on an electromigration current limit set without considering self-heating effects.

In an embodiment, the method determines electromigration-limited currents for a CMOS design library, including self-heating effects in a totally self-consistent fashion.

In an embodiment, the method can be used in conjunction with the library cell thermal conductivity data in order to determine the electromigration-limited currents for a CMOS design library, including self-heating effects in a totally self-consistent fashion.

In an embodiment, self-consistent changes in temperature scale other electrical characteristics of the gate in question, including delay, output signal slew, noise, capacitive loading.

The maximum current limit for library cells can be set by some mechanism sensitive to self-heating of the device and other than electromigration limits.

In an embodiment, a method of approximation is provided that can greatly speed up the thermal analysis, and further when combined with a universal scaling algorithm, it allows rapid determination of the self-consistent maximum current limit.

In an embodiment, characterizing logic gates in a standard cell library employs one central approximation and a universal scaling algorithm in order to greatly speed up a thermal analysis and the process of finding a self-consistent maximum current limit. The approximation relies on the expectation that power dissipation is expected to be relatively uniform within a gate, at least in comparison to the relevant thermal length scales, enabling to approximate the device by a uniform power distribution, within the device regions of the library gate in question.

In one aspect, a method of designing and analyzing CMOS digital circuitry based on characterization a design cell library, the method including: a) determining electromigration-limited currents of the CMOS design cell library without including device-level self-heating effects; b) determining a thermal resistivity from data provided by each design cell of the CMOS library; c) computing a universal scaling curve of allowance reduction of the electromigration-limited currents as a function of the effects of device-level self-heating; d) determining by including a reduction from the self-heating effects the electromigration-limited currents of the CMOS design cell library; and e) obtaining a function of temperature increases from the thermal analysis based on the electromigration current limits.

The relationship between the device current, the resulting self-heating, and the impact to electromigration limits for the gate in question is complicated, without a closed-form solution. At a given temperature value, the electromigration limit can be calculated but the amount of current associated with that particular limit will cause device heating, causing the temperature to deviate from the original temperature assumption. This, in turn changes the electromigration limit, causing the amount of current and associated self-heating to change, requiring yet another adjustment to the temperature, then to the current, and continuing on in this fashion until converging on a self-consistent solution. Rather than trying to solve this iteratively for each library gate, it is possible to solve the relationship once, in a generic fashion, and then using the generic solution in turn for each library gate.

The combination of the two techniques described above allows a self-consistent current limit to be specified for each library gate with very little computational effort. Known solutions can require that each gate be subjected to a detailed thermal analysis to determine the thermal conductivity, a process requiring extensive setup and simulation effort for each individual gate. Then, an iterative numerical analysis can be needed to converge on the self-consistent maximum current, given the amount of self-heating expected at that level of current flow. Due to the difficulty and computationally intensive nature of the analyses, and the need to characterize large numbers (typically thousands) of library cells, current-art digital library characterization techniques have not included the modeling of the self-heating effects. As self-heating effects become more important, neglecting the effects will leave designs open to electromigration-induced reliability failures. Otherwise, applying a set of worst-case assumptions uniformly across all library gates could result in excessive pessimism, leading to a poorly optimized design.

DETAILED DESCRIPTION

In an embodiment, a method of the present disclosure is described hereinafter. However, it is to be understood that the disclosed embodiments are merely illustrative of the described methods that can be embodied in various forms. In addition, each of the examples given in connection with the various embodiments of the disclosure is intended to be illustrative, and not restrictive.

A method for a rapid characterization of library gates provides a current limit (which can be used to define switch-frequency-dependent capacitance load limits) for electromigration robustness, including self-heating effects on the gate when running at the specified current limit.

In one embodiment, the disclosure relies on two main aspects. In the first, a method of approximation determines the thermal resistances of each library cell while in the second, the creation of a universal scaling curve is introduced that can be used to modify the current limits of each cells, calculated initially in a standard, prior art fashion, such that the new current limits include self-heating effects in a self-consistent fashion.

Approximate Calculation of the Thermal Resistance

The aforementioned approximation relies on a relatively uniform power dissipation within a logic gate, or within a critical portion of a complex gate. Since the density of devices (or power generation distribution) is expected to be relatively uniform, the gate can be approximated by a uniform power distribution, within the device regions of the library gate in question. For complex gates, particular limiting sub-regions can be considered, instead of the gate as a whole. The fact that the library cells typically have a fixed size in one direction (e.g., a fixed row height), will improve the accuracy of the approximation, and will limit the number of different parameters needed to approximate the real thermal behavior. An illustrative example of how this process may work is given in the following steps:

1) Measure thermal conductivity factors, $R_{TH}$, for inverters (or other representative library gate) of various sizes. Assuming for the illustrative example that the height of the library gate is fixed, and that only the width "W" of the gate is changing. ($R_{TH}$ can be defined as a function of the area of the gate if the height changes). Also, the environment surrounding each gate in the actual design is unknown (and can vary from instance to instance in the design). Accordingly, the thermal analysis can model the surrounding environment in a uniform fashion, depending on the degree of design conservatism desired.

2) Define curve of $R_{TH}(W)$, from data above, assume it applies equivalently for all library gates 3) Therefore, given W, one can quickly determine approximate $R_{TH}$ for any gate, without any detailed thermal analysis.

4) Other parameters can be included in the fitting of $R_{TH}$ if desired. Such parameters could include the height of the cell (if different images need to be considered), width of the n and p fingers, circuit topology (inverter vs. NAND vs. NOR, and the like), device type and threshold voltage, characteristics of specific sub-regions (e.g. for complex gates).

Generic Scaling Algorithm: Universal Relationship Between Max Current Modifier (M) and $\Delta T_0$ Once the thermal properties of the gate in question are understood, a scaling algorithm can be used to find the self-consistent temperature increase and max current spec consistent with the electromigration requirements at the elevated temperature (i.e., including self-heating effects). This works as follows:

Let $\Delta T_0$ be the temperature rise seen when running the max amount of current through the circuit ($I_0$), allowed by the electromigration specifications at a junction temperature of $T_J$ (without any self-heating included).

I. From the definition of thermal resistance it follows that, $\Delta T_0 = I_0 * V * R_{TH}$ II. Furthermore, assuming that $I = A * \exp[B/(T)]$, describes the electromigration specification for the current in the weakest link of the circuit in question, where A is related to the wiring geometry and also includes technology information, B is a technology constant, I is current, and T is an absolute temperature.

III. Then $I_{SH}/I_0 = \exp[B/(T_J + \Delta T_{SH}) - B/T_J]$, where $I_{SH}$ is the electromigration current limit, including self-heating, and $\Delta T_{SH}$ is the self-consistent temperature increase associated with that amount of current.

IV. Since $\Delta T_{SH} = I_{SH} * V * R_{TH}$, and defining M, the current multiplier for the self heating effect to be $M = I_{SH}/I_0$, then V. $M = \exp[-B * M * I_0 * V * R_{TH}/T_J/(T_J + M * I_0 * V * R_{TH})]$, or $M = \exp[-B * M * \Delta T_0/T_J/(T_J + M * \Delta T_0)]$ VI. Else, finally $M - \exp[-B * M * \Delta T_0/T_J/(T_J + M * \Delta T_0)] = 0$ For a given set of input constants (B, $T_J$), the above defines a universal equation relating M and $\Delta T_0$. This equation can be solved numerically over the range of interest to provide M as a function of $\Delta T_0$; i.e., $M(\Delta T_0)$. Details of the thermal conductivity and amount of current flowing are unimportant (there is only one single independent variable, $\Delta T_0$).

In an embodiment, two approaches are combined into a process flow which can be used to characterize the whole library as shown in the following exemplary flow chart.

Figure 2:
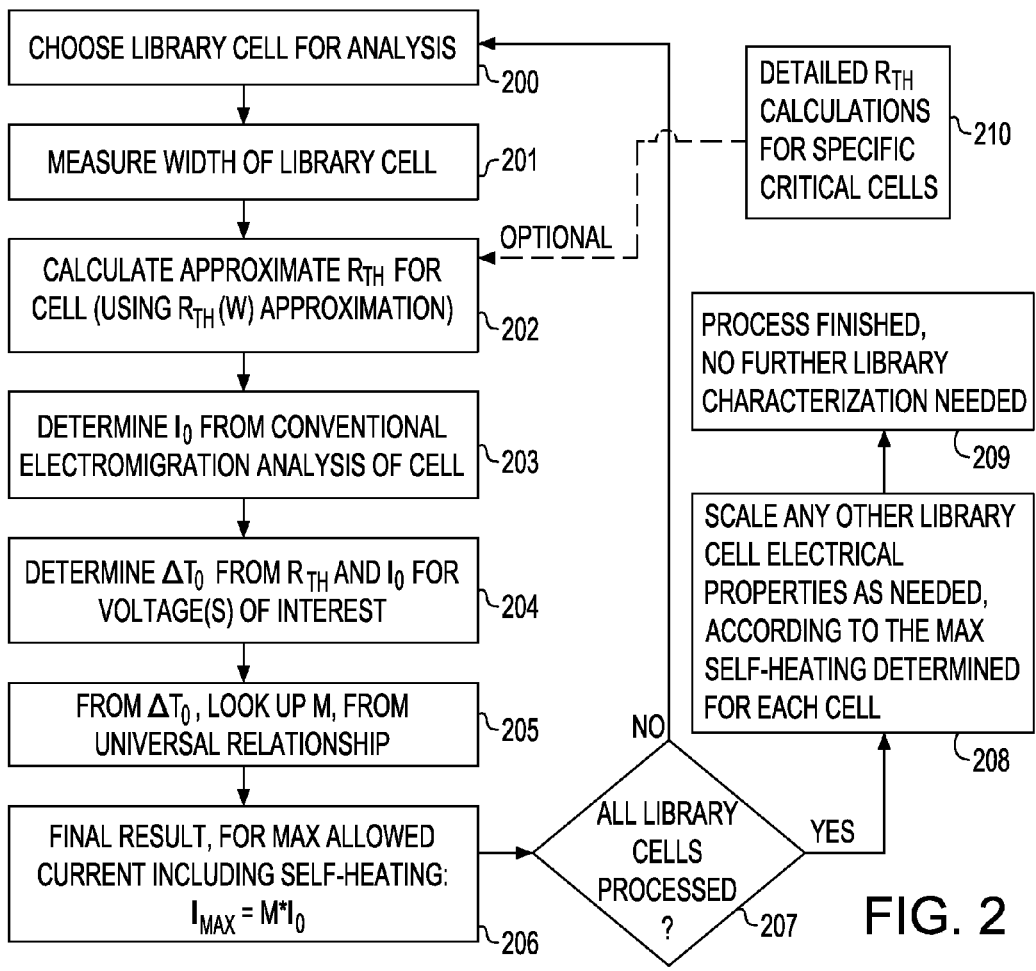
FIG. 2 is a flow diagram showing how self-heating can be included in the library characterization process according to one embodiment of the disclosure.

Still referring to FIG. 2 an embodiment shows steps 201, 202, 204, 205, 208, and optionally 208 have been added to allow detailed modeling of the self-heating effect on each library cell.

Step 201 includes determining the width W of the library cell, but can also optionally include determination of other cell physical parameters, which can be used in the thermal approximation if desired. The parameters might include the width or number of actual device fingers, occupancy percentage of the cell, circuit topology (inverter vs. NAND vs. NOR, and the like), device type and threshold voltage, characteristics of specific sub-regions (e.g., for complex gates), or other parameters of such type.

Figure 3:
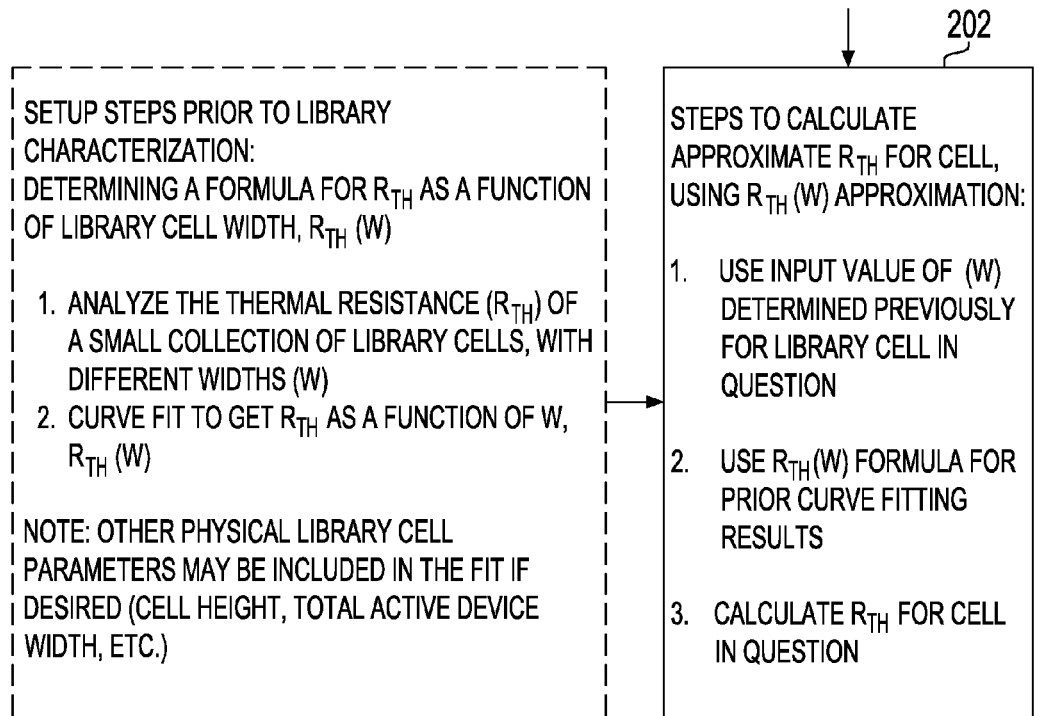
FIG. 3 illustrates details of step 202 as illustrates in FIG. 2, explaining how the thermal resistance, $R_{TH}$ can be rapidly determined for each library cell, according to one embodiment of the disclosure.

Referring to FIG. 3 details of step 202 are provided, wherein in one aspect of the disclosure, the method performs an approximate calculation of thermal resistance $R_{TH}$. The $R_{TH}$ approximation relies on the relatively uniform power dissipation within a logic gate, or within a critical portion of a complex gate. Since the density of devices (or power generation distribution) is expected to be relatively uniform, the gate can be approximated by a uniform power distribution within the device regions of the gate in question. For complex gates, particular limiting sub-regions can be considered, instead of the gate as a whole. The fact that the library cells typically have a fixed size in one direction (e.g., a fixed row height) can improve the accuracy of the approximation, and limit the number of different parameters needed to approximate the real thermal behavior. In an illustrative example, the approximation can be preferably set up as follows. First, the thermal conductivity factors, $R_{TH}$, are measured for inverters (or other representative library gate) of various sizes.

In an illustrative example, the height of the library gates is fixed, and only the width "W" of the gate is changing. ($R_{TH}$ could be defined as a function of the area and aspect ratio of the gate if the height changes). Moreover, the environment surrounding each gate in the actual design is unknown (and can vary from instance to instance in the design). Therefore, the thermal analysis can model the surrounding environment in a uniform fashion, depending on the degree of design conservatism desired. Then, a curve of $R_{TH}(W)$ can be defined by fitting the data above, with the assumption that the curve will apply equivalently for all library gates. The fitting procedure can be extended to include any other physical parameters of the library cell as described in the section in reference to step 201. In step 202, the curve of $R_{TH}(W)$, determined ahead of time, is used to estimate $R_{TH}$ of the gate in question, given the measured width, W (and/or any other parameters used for the $R_{TH}$ fitting). This fitting procedure is illustrated in the dashed box on the left hand side of FIG. 3.

Step 203 is similar to step 103 in the prior art FIG. 1, with the maximum current $I_0$ determined at the baseline temperature condition, at a temperature $T_J$, based on the cell wire geometries and the reliability specifications, but without any self-heating.

Figure 4:
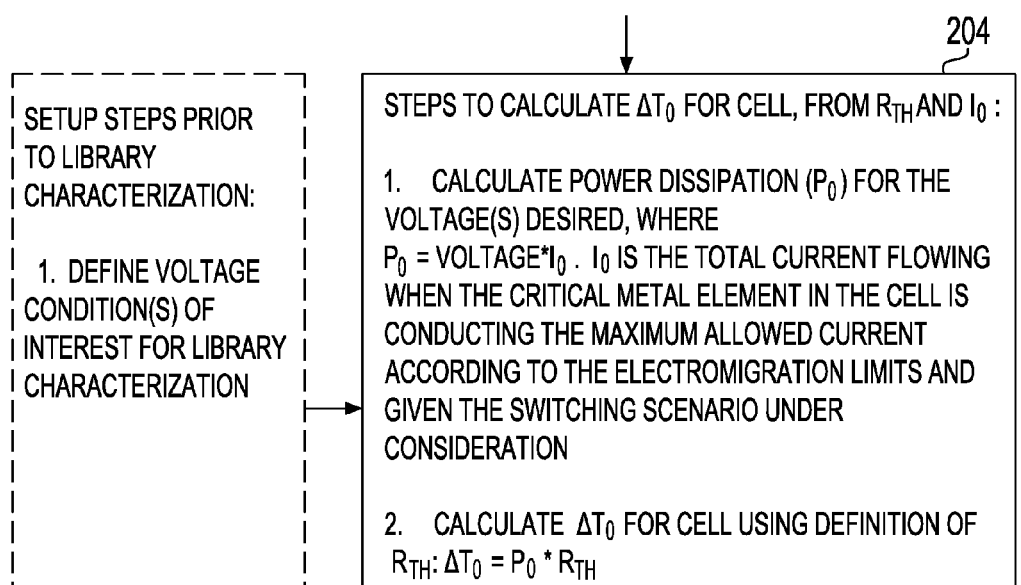
FIG. 4 shows details of step 204 shown in FIG. 2, illustrating how a base temperature increases as determined for each library cell, according to one embodiment of the disclosure.

Step 204 then calculates the temperature increase $\Delta T_0$ that can be caused if the conventional maximum current, $I_0$, calculated in step 203 without allowance for any self-heating that were allowed to flow. The details of this procedure are shown in FIG. 4. In general, the temperature rise from self-heating $\Delta T$ is expressed as $\Delta T=I*V*R_{TH}$ where I is the average current, V is the voltage, and $R_{TH}$ is the thermal conductivity. Since $R_{TH}$ for the library gate in question was calculated in step 202, $\Delta T_0$ can now be calculated in step 204 as $\Delta T_0=I_0*V*R_{TH}$.

Figure 5:
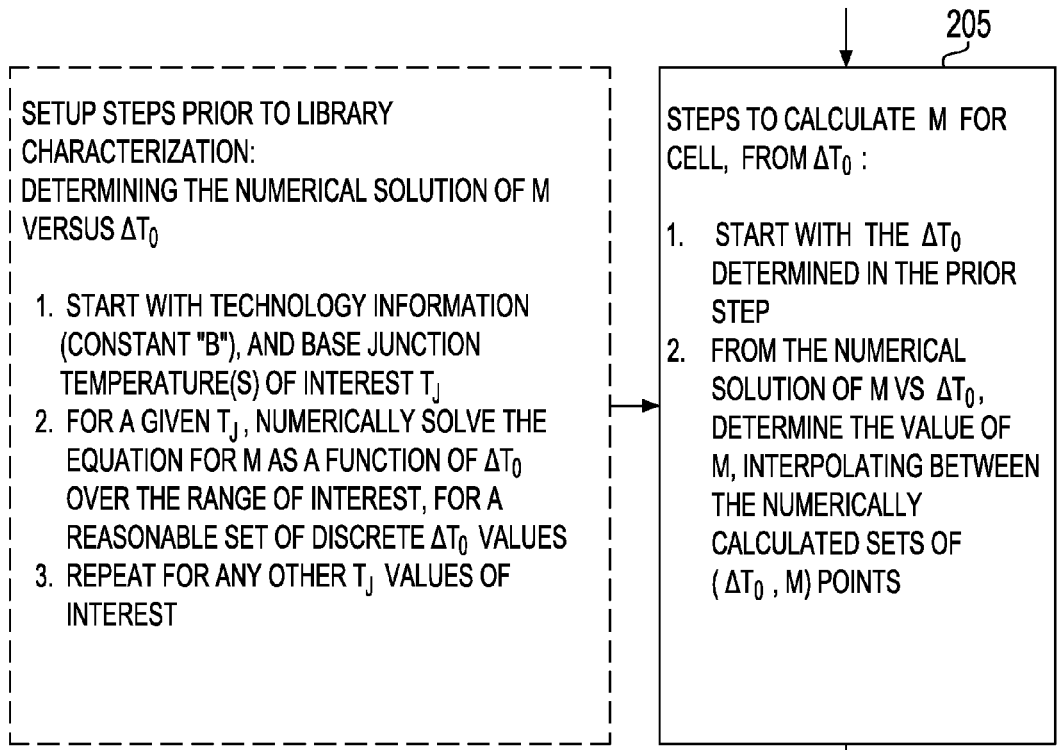
FIG. 5 shows details of step 205 shown in FIG. 2, explains how the multiplier M is determined, wherein M is a factor that describes a reduction in maximum allowable current as a result of the self-heating induced by the power dissipated by the library cell when the maximum current is conducted by the critical metal element in the library cell.

Referring now to FIG. 5, details of step 203 are described, wherein an universal scaling relationship as part of the disclosure allows a rapid calculation of a multiplier "M" used to describe the impact of self-heating effects on the conventional maximum current, $I_0$. The maximum current allowed, including self-heating is defined to be $M*I_0$, and the determination of M for each library gate is thus the crucial step in determining the impact of self-heating on the current limit for each gate.

The scaling relationship is derived before library characterization begins, as illustrated on the left side of FIG. 5. The scaling begins by assuming that the equation $I=A*\exp[B/(T)]$, describes the electromigration specification for the current in the weakest link of the circuit in question, where A is related to the wiring geometry and also includes technology information, B is a technology constant, I is current, T is the temperature. This is a standard formula for electromigration analysis, part of the known art. Using this equation, it then follows that $I_{SH}/I_0=\exp[B/(T_J+\Delta T_{SH})-B/T_J]$, where $T_J$ is the baseline temperature without self-heating, $I_{SH}$ is the electromigration current limit, including self-heating, and $\Delta T_{SH}$ is the self-consistent temperature increase associated with that amount of current. Now $\Delta T_{SH}=I_{SH}*V*R_{TH}$, and since M is defined to be $I_{SH}/I_0$, it follows that $$M=\exp[-B*M*I_0*V*R_{TH}/T_J/(T_J+M*I_0*V*R_{TH})], \text{ or}$$
$$M=\exp[-B*M*\Delta T_0/T_J/(T_J+M*\Delta T_0)], \text{ or finally,}$$
$$M-\exp[-B*M*\Delta T_0/T_J/(T_J+M*\Delta T_0)]=0.$$

For a given set of input constants, B, and $T_J$, the above defines a universal equation relating M and $\Delta T_0$. This equation can be solved numerically ahead of the library characterization effort, over the $\Delta T_0$ range of interest to provide a lookup table of M as a function of $\Delta T_0$. The important feature of this equation is that the details of the thermal conductivity and amount of current that flows are unimportant, all that is needed is the $\Delta T_0$. Therefore, given the $\Delta T_0$ determined from step 204, this universal relationship between M and $\Delta T_0$ can be used to determine M, as shown in the box on the right hand side of FIG. 5.

Finally, in step 206, the maximum current including self-heating, is calculated, i.e. $I_{MAX}=M*I_0$.

Figure 6:
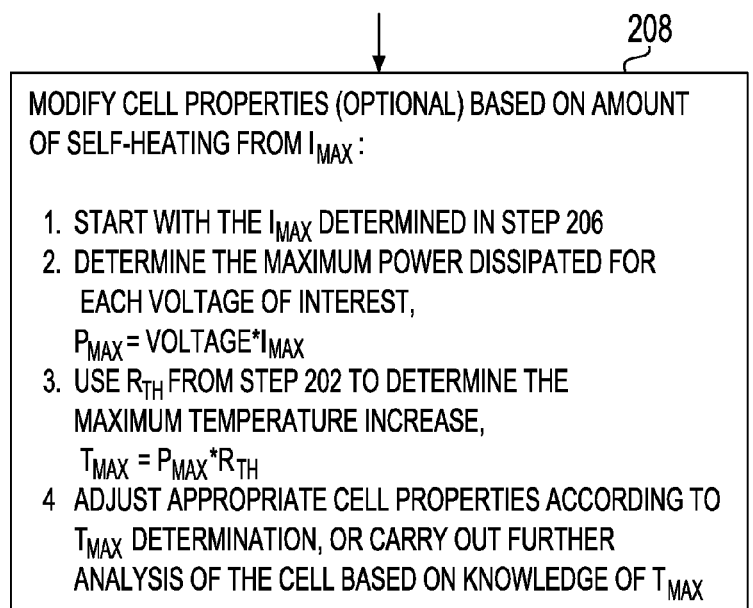
FIG. 6 shows details of step 208 illustrates in FIG. 2, explaining how other cell parameters may be adjusted based on the temperature increase of the cell when conducting the maximum allowed current.

Step 207 is used to determine whether all cells are processed, as in the prior art flow (107). Step 208 is an optional step, shown in detail in FIG. 6, whereby the other electrical properties of the cell can be updated based on the amount of self-heating, which is simply $\Delta T_{MAX}=I_{MAX}*V*R_{TH}$ from above, or $\Delta T_{MAX}=M*I_0*V*R_{TH}$. It may also be desirable to carry out other cell-based analyses (for example in order to provide the maximum, or worst-case impact on electrical characteristics such as delay, output signal slew, noise, capacitive loading, etc.) after $\Delta T_{MAX}$ has been determined, using $\Delta T_{MAX}$ as an input. Step 209 finishes up the process, as in the prior-art flow (109). Step 210 is another optional step whereby improved accuracy can be obtained, if desired, for specific cells by doing a more detailed calculation of $R_{TH}$.

Finally, it should be noted that this same set of techniques can be applied to any current limit imposed for reasons other than electromigration, but which is dependent on self-heating in a well-defined fashion. Hereinafter are several illustrative examples:

Example #1

Cell DC leakage should not increase by more than some amount above a nominal value (assume leakage is negligible part of total cell power). Since leakage increases with temperature, this would set a maximum temperature increase for each cell that could be tolerated. In this case the relationship between M and $\Delta T_0$ is trivial, but the approximation for thermal resistance is important.

Example #2

Cell temperature should not increase by more than a set amount from static leakage current flowing at a particular background temperature and voltage. In this case, as temperature increases, DC leakage also increases, so the relationship between M and $\Delta T_0$ is not trivial, although $\Delta T_0$ is fixed for every cell, in this case. For this type of situation, it might be desirable to translate the resulting leakage current limit for the cell back into a voltage limit (at a particular temperature), or a temperature limit (at a particular voltage), or a boundary voltage and temperature limiting curve (or surface, including process variations or other variables).

While the present disclosure has been particularly shown and described with respect to preferred embodiments thereof, it will be understood by those skilled in the art that the foregoing and other changes in forms and details can be made without departing from the spirit and scope of the present disclosure. In one therefore intended that the present disclosure not be limited to the exact forms and details described and illustrated, but fall within the scope of the appended claims.

The invention claimed is:

1. A method of designing and analyzing CMOS digital circuitry based on a characterization of a CMOS design cell library, the method comprising:
   a) determining electromigration current limits of design cells of said CMOS design cell library without including device-level self-heating effects;
   b) determining a thermal resistivity of the design cells based on data provided by said CMOS design cell library for the design cells;
   c) determine temperature changes for the design cells for a specified voltage based on the determined electromigration current limits and the determined thermal resistivity;
   d) computing a universal scaling curve of allowance reduction of electromigration current limits due to device level self heating effects as a function of temperature changes; and
   e) applying the computed universal scaling curve to the determined temperature changes to determine reductions to said electromigration current limits of said design cells due to said self heating effects.

2. The method as recited in claim 1, wherein said cell thermal resistivity is based on generic physical attributes that includes width, height of said cells, a number and size of device fingers.

3. The method as recited in claim 1, wherein said computing said universal curve of allowance reduction due to device level self-heating effects is a function of said temperature changes without considering any of said device-level self-heating effects.

4. The method as recited in claim 1, wherein a self-consistent change in temperature caused by device self-heating scales other electrical characteristics of a CMOS gate that further comprise scaling delay, output signal slew, noise, and capacitive loading.

5. The method as recited in claim 1 whereby a maximum current limit for said library cells is set by a mechanism sensitive to self-heating of a CMOS device other than said electromigration limits.

6. The method as recited in claim 1, further comprising a rapid characterization of library gates by way of current-limit-defining switch-frequency-dependent capacitance load limits for electromigration robustness, including self-heating effects on a gate when running at a predetermined current limit.

7. The method as recited in claim 1 further comprising an approximate computation to determine said thermal resistances of each of said cell library cell when creating said universal scaling curve modifying said current limits of each of said cells.

8. The method as recited in claim 7 wherein said universal scaling curve modifies said current limits initially calculated, providing new current limits including self-heating effects in self-consistent fashion.

9. The method as recited in claim 7 wherein said approximate computation of said thermal resistance relies on uniform power dissipation within said logic gate or within a critical portion of a complex gate.

10. The method as recited in claim 7, further comprising speeding up a thermal analysis by finding a self-consistent maximum current limit characterizing said logic gates in said standard cell library.

11. The method as recited in claim 7 wherein at a predetermined temperature value, said electromigration limit determines an amount of current associated with a predetermined limit that causes device heating, and wherein said predetermined temperature leads to a deviation from an original assumed temperature.

12. The method as recited in claim 11 wherein in presence of said deviation from said original assumed temperature, said predetermined electromigration limit is set to cause an amount of current and associated self-heating.

13. The method as recited in claim 12, wherein said amount of current and said associated self-heat changes requires a further adjustment to said temperature, and wherein said current is adjusted until it converges on a self-consistent solution.

14. The method as recited in claim 12 wherein a combination of techniques allows a self-consistent current limit to be specified for each library gate.

15. The method as recited in claim 14 further comprises conventional solutions requiring that each of said library gate is subjected to further detailed thermal analyses to determine a thermal conductivity.

* * * * *